(12) United States Patent
Allen, Jr. et al.

(10) Patent No.: US 6,208,982 B1
(45) Date of Patent: Mar. 27, 2001

(54) METHOD AND APPARATUS FOR SOLVING COMPLEX AND COMPUTATIONALLY INTENSIVE INVERSE PROBLEMS IN REAL-TIME

(75) Inventors: John D. Allen, Jr.; Nenad Ivezic, both of Knoxville; Gerard M. Ludtka, Oak Ridge; Thomas Zacharia, Knoxville, all of TN (US)

(73) Assignee: Lockheed Martin Energy Research Corporation, Oak Ridge, TN (US)

( * ) Notice: Subject to any disclaimer, the term of this patent is extended or adjusted under 35 U.S.C. 154(b) by 0 days.

(21) Appl. No.: 08/903,068

(22) Filed: Jul. 30, 1997

Related U.S. Application Data (60) Provisional application No. 60/031,150, filed on Nov. 18, 1996.

(51) Int. Cl.[7] .................................................. G06F 15/16

(52) U.S. Cl. .............................. 706/11; 706/23; 706/19; 706/15

(58) Field of Search .................................. 706/1, 11, 14, 706/15, 21, 23

(56) References Cited

U.S. PATENT DOCUMENTS

| | | | |
|---|---|---|---|
| 3,748,440 | * | 7/1973 | Alexander ............................ 235/408 |
| 4,210,966 | * | 7/1980 | Ingram .................................. 367/27 |
| 5,048,086 | * | 9/1991 | Bianco et al. ......................... 380/28 |
| 5,230,340 | * | 7/1993 | Rhyne ................................... 600/447 |
| 5,680,784 | * | 10/1997 | Tateno et al. ........................... 72/8.7 |
| 5,696,828 | * | 12/1997 | Koopman, Jr. ........................ 380/46 |
| 5,757,923 | * | 5/1998 | Koopman, Jr. ........................ 380/46 |

OTHER PUBLICATIONS

Vibet, C., General Method of Finding Initial Conditions, pp. 46–48, Feb. 1988.*

Dedieu, Herve, et al., Signal Coding and Compression Based on Chaos Control Techniques, pp. 1191–1194, Dec. 1995.*

Article entitled "Digitized Data Segmentation Using Neural Networks For Reverse Engineering" by Alrashdan et al., published in Videometrics III, SPIE vol. 2350, Feb. 11, 1994, pp. 299–305.

(List continued on next page.)

*Primary Examiner*—Tariq R. Hafiz
*Assistant Examiner*—Wilbert L. Starks, Jr.
(74) *Attorney, Agent, or Firm*—Lockheed Martin Energy Research Corporation (57) ABSTRACT

The system of the present invention may "solve" a variety of inverse physical problem types by using neural network techniques. In operation, the present invention may generate data sets characterizing a particular starting condition of a physical process (such as data sets characterizing the parameters of an initial metal die), based upon an ending condition of the physical process (such as the parameters of the metal part to be stamped by the die). In one embodiment, the system of the present invention may generate a plurality of training data sets, each training data set characterizing a sample ending condition, the physical process that results in the sample ending condition, and a sample starting condition of the physical process. The training data sets may then be applied to a neural network so as to train the network. A network definition associated with the trained neural network may be stored, and an ending data set characterizing an ending condition of the physical process may be generated. A starting data set characterizing a starting condition of the physical process may thereafter be generated based upon the stored network definition and the ending data set.

9 Claims, 7 Drawing Sheets

OTHER PUBLICATIONS

Article entitled "An Improved BP Algorithm and Its Application In Manufacturing Of Stamping Dies Of Car Body", by Hu et al.; published in Proceedings of the International Conference on Computer Integrated Manufacturing, vol. 2, Jul. 11, 1995, pp. 1461–1468.

Article entitled "Neural Network Approach to The Reconstruction Of Freeform Surfaces For Reverse Engineering", by GU et al., published in Computer Aided Design, vol. 27, No. 1, Jan., 1995, pp. 59–64.

Article entitled "Application Of Fuzzy Set Theory And Back–Propagation Neural Networks In Progressive Die Design", by Zone–Ching et al., published in Journal of Manufacturing Systems, vol. 15, No. 4, 1996, pp. 268–281.

Article entitled A Neural Network Approach To Circuit Extraction:, by Zhang et al., published in IEEE, Apr., 1997, vol. 1, pp. 475–479.

* cited by examiner

FIG.1

CONSTITUENTS OF A TYPICAL BACKPROPAGATION OF ERROR NEURAL NETWORK

FIG.2

PROCESS MODELLING STAGE

FIG.3A

NEURAL NETWORK TRAINING STAGE

FIG.3B

METHOD APPLICATION STAGE

FIG.3C

THE PREFERRED IMPLEMENTATION

PATCH METHOD SCHEMATIC DIAGRAM

FIG.8

WAVELET-COMPONENT / NETWORK-NODE MAPPING SCHEME

METHOD AND APPARATUS FOR SOLVING COMPLEX AND COMPUTATIONALLY INTENSIVE INVERSE PROBLEMS IN REAL-TIME

CROSS-REFERENCE TO RELATED APPLICATION

This application claims priority and fully incorporates herein, U.S. Provisional Patent Application Ser. No. 60/031,150, filed Nov. 18, 1996, and entitled "Method for Combining Artificial Neural Networks and High-Performance Computing Systems so as to Support Computationally Intensive Simulation and Process Modeling in Inexpensive Desktop Computing Environments".

BACKGROUND OF THE INVENTION

1. Field of the Invention

The present invention relates generally to a system and method of application of an artificial neural network to solving an inverse physical problem, whereby an unknown starting condition of a physical process is determined based upon a known ending condition. Such an artificial neural network may be used for various purposes, such as the creation of a die design based upon a metal part specification, in one embodiment.

2. Description of the Prior Art

Among the most difficult problems of modern science and engineering are those requiring for their solutions the computational resources of the world's largest and fastest supercomputers. Typical problems include aerodynamic modeling, weapons modeling, structural modeling, material property modeling at both atomic and molecular scales, material process modeling, weather forecasting, etc.

The computational resources essential for the efficient evaluation of these and similar modeling problems are extremely expensive and are readily accessible at but few of the major National Laboratories and Research Centers. Even in the context of these very powerful computing systems and those anticipated soon to be tens or hundreds of times more powerful still, processing times may exceed days or weeks for problems of relatively modest proportions. The inevitably limited access to such machines severely limits the number of problems that may be addressed. Compounding the issue of limited access is the fact that many, perhaps most, of the problems submitted to these machines for solution are of a very specific nature (for example, material and/or process modeling involving process parameters and material properties of limited ranges). Thus, the solutions obtained are applicable over a usually very limited range in the values of the defining parameters and arc of relatively little utility beyond the specific regimes for which the calculations have been performed. Without question, the results of these modeling studies are very accurate (within the limitations imposed by the underlying theory). Nevertheless, the ensuing "point results" are of little general utility since the broader physical relationships inherent in their development are in no generally applicable manner captured by the numerical results of the modeling programs.

One example of a complex computational problem is that of designing a die for producing a metal part (e.g., a car fender or door). As presently performed, the die design process for a part of any substantive complexity is highly iterative in nature. Moreover, it is a process whose successful execution depends to a very great extent on the acquired art of a limited and diminishing number of human experts. A measure of the difficulty of the die design task and, thus, an estimate of the importance of the new method are suggested by the oft-quoted assertion that reducing by one or two the required number of design iterations for a complex part could save $20 billion dollars per year in the automotive industry alone.

It is important to bear in mind that modern computational methods are quite capable of solving a variation of the die design problem. Thus, if a die configuration Is known, it is possible to compute the configuration of the part that would result from a forming operation involving the die under a specified set of conditions (ram speed, lubrication, hold-down force, et.). Although not trivial, the computations required for the solution of this "forward" problem are well within the capabilities of any contemporary high-end computing system.

The "Inverse" problem, on the other hand, is extremely difficult, if not impossible, to solve generally by conventional mathematical or computational methods, regardless of the computational resources applied. In view of this, a more formal statement of one specific problem addressed by the present patent may be taken as development of a computational method whereby a particular "inverse" problem, production of a die design given a part specification, could be solved using available technologies. A more encompassing definition of the general problem addressed by the present patent would include development of a general computational method whereby previously intractable "inverse" problems from other disciplines could be solved. Examples are found in such diverse areas as metal forging, glass and ceramic production (indeed, material design in general), process control (a nuclear reactor or chemical plant, for instance), traffic flow optimization, and many others.

It should be noted that a variation of the above-described problem, and any solution thereto, is of particular relevance in those process control applications for which the capability to learn not only the operating schema of a complex system but mechanisms for correcting "off-normal" operation of such a system can be of great importance. As applied to the material stamping problem, this capability can be employed to compensate for such inevitable effects as die wear variations in material thickness and material properties, and the like.

The traditional die design process is, as already noted, an iterative one in which a craftsman produces, based on his experience, a "first guess" representation for the die configuration he deems most likely to produce a "target" part in the material required and under the stamping conditions specified. A part is formed using the die (and the associated "tooling") and characterized using one or another form of three-dimensional metrology. Unless the designer is very lucky, this first formed part will deviate substantially from the specified target part. The skilled designer utilizes the deviations to guide his development of a refined die representation. A second die is fabricated and a second part formed and characterized. Very likely, this second part is found to deviate less severely than the first from the target part but not yet to conform to it. Thus, the process is repeated again and again until the worst-case deviations are found to be within some specified tolerance limit. Perhaps a half-dozen iterations, each costing tens of thousands of dollars or more, may be required before a satisfactory die is produced.

As suggested by the highly iterative nature of the traditional die design process, a new die design can require months for its final realization. Related to this time is a considerable cost. It is not unusual for the design process for a relatively simple component to cost $50,000 or more. Both of these considerations carry a considerable burden in a modern industrial setting wherein it is often necessary to design a product as complex as an automobile from scratch and produce a working prototype within one year. There is therefore a significant need in the art for a system and process for solving an "inverse" problem as described above, and more specifically a system for designing dies for metal stamping.

SUMMARY OF THE INVENTION

The present invention comprises a methodology whereby the immense power of the largest and most powerful computational resources can be made available to users possessed of nothing more powerful than a desktop computer, thereby permitting computationally intensive inverse solution, optimization, and decision-making analyses to be carried out at very modest expense. Only when these latter have led to the prescription of an acceptable system or process might final validation in the context of a supercomputer be required.

The system of the present invention may "solve" a variety of inverse physical problem types by using neural network techniques. In operation, the present invention may (venerate data sets characterizing a particular starting condition of a physical process (such as data sets characterizing the parameters of an initial metal die), based upon an ending condition of the physical process (such as the parameters of the metal part to be tamped by the die).

In one embodiment, the system of the present invention may generate a plurality of training data sets, each training data set characterizing a sample ending condition, the physical process that results in the sample ending condition, and a sample starting condition of the physical process. The training data sets may then be applied to a neural network so as to train the network. A network definition associated with the trained neural network may be stored, and an ending data set characterizing an ending condition of the physical process may be generated. A starting data set characterizing a starting condition of the physical process may thereafter be generated based upon the stored network definition and the ending data set.

DETAILED DESCRIPTION OF THE INVENTION

1. Artificial Neural Networks

Among the many computational methods developed (or, as has frequently been the case, redeveloped) during the last decade or so are those best described by the term "connectionist". Most of these have come to be referred to by the term "artificial neural network" or, more often, simply "neural network". The label arises from the asserted (but distant) similarity between the individual computational elements of neural networks and the fundamental entities of the human brain, the biological neurons and the dendrites and axons which support the principal mechanisms of biological neuron interconnection and activation.

For present purposes, most of the connectionist methods classified as artificial neural networks are reasonably well defined by the following:

"An artificial neural network is a modifiably interconnected set of active, generally non-linear, elements (accurately or not, usually called neurons) which, in some fashion, accept input signals from their environment and which both return to that environment some indication of their collective response to these signals and adjust the relevant characteristics of their interconnectivity in a manner which tends to increase the network's capacity for giving unique responses to stimuli with which, by training, it becomes increasingly familiar."

Figure 1:
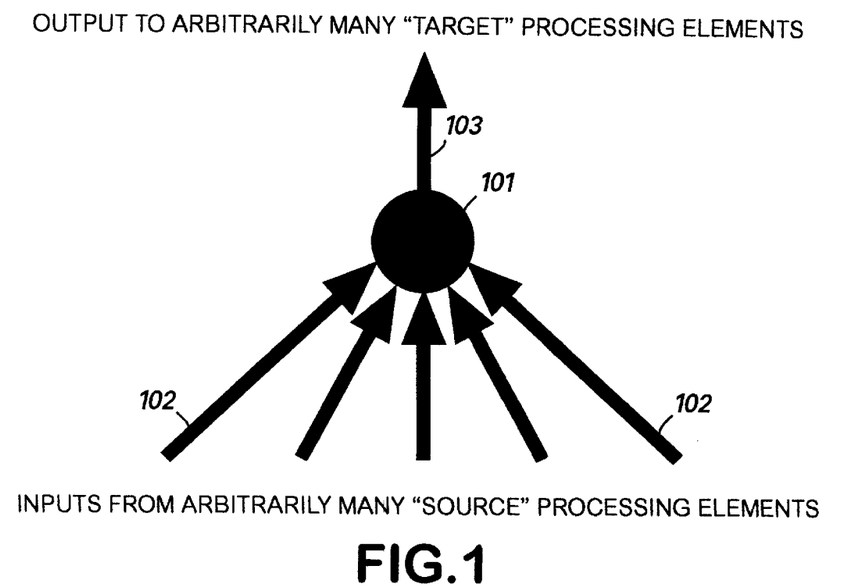
FIG. 1 is a typical processing element in a neural network.

The neurons (or, more properly, the processing elements. PEs, or nodes) are, depending upon the specific software or hardware network implementation, mathematical or physical entities each capable of accepting an input signal (itself usually the sum of several contributions) and producing in response thereto an output signal whose value is some function of the total input signal value. FIG. 1 depicts a typical neural network processing element (PE) 101, with inputs 102 from an arbitrary number of source processing elements, and an output 103 to an arbitrary number of target processing elements. In many cases of interest, the response or transfer-function by which the PE output value is determined is taken to be the simple Sigmoid relation.

Linking the PEs 101 to one another are the connections (hence, the generic term "connectionist") or "weights" (as they are generally referred to in the vernacular). Again. depending upon the specific network implementation, these may be either mathematical or physical entities. The weights mediate the inter-PE communications each weight determining the signed fraction of the signal representing the output of some "source" PE that will be communicated to the input terminal of some (usually, but not necessarily, distinct) "target" PE. It is the sum of all the signals impinging upon a PE input terminal 102 which is employed in computing the PE output value 103.

It is important to note one of the significant departures from reality characteristic of artificial neural networks. The conventional PE representation is predicated on the assumption of, at worst, quasi-continuous signal values. Biological neurons, on the other hand, produce randomly distributed pulses of approximately equal amplitude and duration. The number of these pulses occurring in some time interval is what is (very) approximately modeled by the instantaneous output values of the PEs of an artificial neural network.

The behavior of an artificial neural network is determined principally by the distribution of PEs 101, the particular form of the PE interconnectivity, and the "learning, rule" by which alterations are made to the weight values in response to presented input 102 and (where appropriate) output signals 103. Of the many possible configurations of PEs, connections, and learning rule, variations on one of the simplest, the back propagation of error (or backprop) network, have proved to be of perhaps the greatest general utility.

Figure 2:
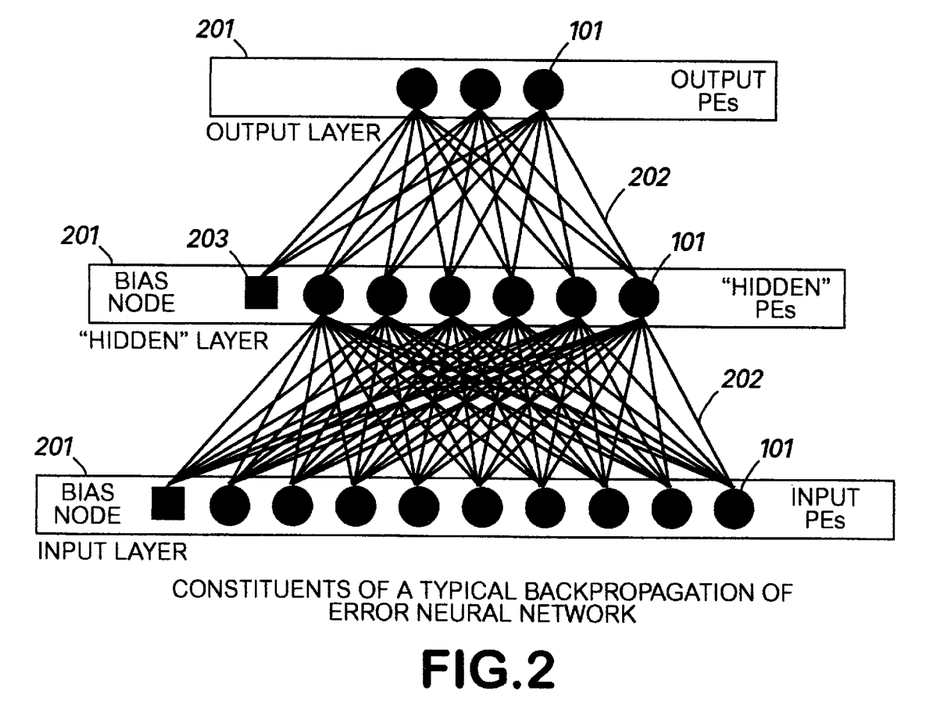
FIG. 2 depicts a typical backpropogation neural network.

In the backprop network scheme, the PEs 101 are arranged in three or more "layers" 201 as depicted in FIG. 2. Here, circles represent the processing elements (PEs) 101, lines 202, the connections. The small squares 203 denote "bias nodes" whose outputs are maintained at some fixed value (usually unity). The bias nodes 203 support a mechanism whereby network training, not any a priori set of assumptions, leads to a determination of the "operating points" for all other (non-bias) network PEs.

The layers of a typical backpropagation network usually include one referred to as an input layer, one designated the output layer, and one or more intermediate (or "hidden") layers. In a standard backprop network (but by no means so in all networks), connections (the weights) are entirely unidirectional (i.e., they communicate signals in only one direction) and link PEs on a given layer only to PEs on the immediately superior layer. In such a network, each PE on any layer is connected to all PEs on the layer immediately above it (stated another way, each PE on some layer receives signals only from all PEs on the layer immediately below it).

PEs 101 on the uppermost layer are usually arranged to correspond (in the simplest case) one-for-one to the properties or parameters (the dependent variables) about which the network is intended to "learn". PEs 101 on the lowermost layer are taken to correspond similarly to the "independent variables" on the basis of which network training is expected to take place. If, for instance, a network is to learn to add two numbers to produce a third, the lowest network layer will include precisely two non-bias PEs 101, one for each addend. The uppermost, or top, layer will include precisely one PE 101 representing the sum. One or more intermediate layers will include numbers of PEs 101 determined, principally on the basis of experience and experiment, to be adequate for the particular training task at hand.

Training a network of the backprop variety involves presenting the input nodes with signals representing the values of the independent variables, the output node (or nodes) with signals representing expected values for the dependent variable(s), and, after evaluating the network response(s) to the inputs, using any resultant discrepancies between expected and realized output signals to effect modification of the strengths of network connections in such a manner as to reduce the discrepancies. For the simple addition example noted above, the two input nodes would be supplied with signals representing successive pairs of numbers whose sums the network was to learn to reproduce. The single output node would be presented with corresponding signals representing the sum of the values currently applied to the input nodes. If the network has learned to reproduce the sums accurately, the signal developed at the output node during normal "forward" operation of the network would represent precisely the sum of the two input signals.

If the network is imperfectly trained (as, almost certainly, it would initially be). there will be discrepancies between the network-produced signals and the desired results for some or all of the presented training examples. The term "backpropagation of error" derives from the process by which these discrepancies are propagated in the reverse direction through the network, from top layer to bottom, to effect alterations of network weights of such magnitudes and signs as to reduce the discrepancies encountered during subsequent "forward" network operation. For all but thoroughly inconsistent data sets, this process, when applied repeatedly, reduces the overall error for all members of a training set.

A great advantage conferred by the neural network approach to learning the characteristics of some domain derives from the network's capability for generalization. Thus, for example, if a network has learned to add pairs from some sparse, but representative, set of the numbers in the range 0.0 to 100.0, it will be capable of adding other pairs of numbers in the same range which were not members of the training set. Similar behavior is observed in other applications of neural networks. If, for instance, a network is exposed to sparse, but well distributed, data representing the flight of a projectile (perhaps a cannon ball) in air (initial muzzle velocity, muzzle elevation angle, projectile impact point, etc.), the network will learn to predict impact points for values of muzzle velocity and elevation not included in the training set as long as these values lie within or not too far outside the extremes of the trained-for ranges. Moreover, the network will develop a functional representation for effects not explicitly expressed in the training data (here, air resistance, variation of g with altitude, etc.).

It is important to note that it is not necessary during training to present the network with all examples which might be drawn from some domain of interest in order for the network to develop a reasonable accurate and very general representation of the domain as a whole. The network is not "memorizing" examples, but instead developing a generalization from a limited set of specific cases. This characteristic is observed whatever the complexity of the problem so long as there has been proper network preparation. This "universal approximation" capability of neural networks has been theoretically demonstrated and verified in many practical applications.

The utility of the "universal approximation" capability in the context of a particular application of the present invention is implicit in the observation that, whereas it is relatively easy (if computationally intensive), given a specified die configurations to employ standard computational methods to model the material deformation process under some set of specified stamping conditions so as to determine a final part configuration, it is quite difficult, if not impossible, to perform the computational operations in "reverse order". Thus, given a desired part shape, the direct computational determination of the configuration of a die that, in a stamping operation, would lead to production of the desired part shape cannot presently be performed. It is the ability of a neural network to generalize from the easily computed "forward" examples presented to the network in "reverse" order that makes possible the desired generalization of the inversion process.

To this point, network behavior has been described in essentially static terms. Equally important is the fact that networks similar to the standard backpropagation variety but including feedback paths in one form or another can be made to learn in a time-dependent manner. Thus, the evolution of very complex physical processes can be expressed effectively in suitably trained neural networks. Examples of pertinent applications can be drawn from process modeling, industrial process control, critical path analysis, etc. In each of these areas, relatively sparse results from computational modeling can be codified in a neural network to yield a more generally applicable and much faster-executing representation.

Perhaps as important for prediction tasks of any sort is a form of post-analysis which can be performed upon a neural network once it has been trained in the context of a complex data set. Inherent in the very mechanisms by which a network "learns" are the ingredients with which to assess the nature and extent of the influences (which may, of course, change with time) that various combinations of parameters will have upon network predictions. Careful analysis of the internal weight structure of a fully trained neural network can lead to a set of approximate "rules-of-thumb" which the human can use for quick estimates of likely trends in very complex domains.

In sum, therefore, a neural network (of the backpropagation variety, for instance) can be presented with relatively sparsely distributed data defining, the behavior of a system of interest (an airplane wing, an industrial process, a nuclear device, etc.) and can develop from these data a comprehensive, but not necessarily highly precise, representation (either forward or inverse) of the system broadly applicable to conditions not explicitly included among the data with which the neural network was prepared. The advantage conferred in this process of network codification is that subsequent evaluation of a system of interest, in the context now of the neural network representation thereof, requires at most a few milliseconds, not the tens, hundreds, or thousands of hours required to reach essentially the same result by direct computational modeling on a supercomputer. For those systems for which good approximations are acceptable and difficult or impossible to obtain by other methods, this advantage confers nearly inestimable value.

2. Computational Modeling

The term "computational modeling" refers in general to the set of methods by which the behavior of a physical system of potentially great complexity can be studied in a computing environment. Of the many techniques or the general type, one generally referred to as finite element analysis (FEA) is among the most widely employed. In applying this method, the object or system to be modeled is subdivided into a very large number of two- or three-dimensional elements or cells. For each of these elements, computable mathematical relations are supplied defining the physical laws governing its microscopic-level behavior in response both to the behavior of its neighboring elements and to the details of externally applied forces. If the elements are sufficiently small to capture the physical processes of importance to a given application (and given accurate underlying theories of physical reality) and if they are distributed (and, during execution, redistributed) suitably over the volume of the object or system to be modeled, successive evaluations of the provided mathematical relations for all elements can lead to a very accurate representation of the behavior of the object or system in response to any arbitrary applied forces.

Another generally useful and widely employed computational modeling paradigm is Discrete Event Simulation (DES). Here, one employs knowledge of the temporal behaviors of elemental sub-processes to elucidate the overall time-dependent behavior of a complex system or process.

The relatively simple concept of developing the large-scale, or macroscopic, behavior of a system or process from the computed behaviors of the individual constituents lends itself naturally to program execution on massively parallel processing (MPP) systems, computers having hundreds or thousands of individual processors each able to communicate efficiently with the others and with a not inconsiderable quantity of memory. Each processor in such a system is assigned the task of performing the calculations associated with a set of elements or cells (rarely are there enough processors to support the luxury of assigning one processor to each cell).

Since time is almost always a variable in computational modeling tasks, it is generally arranged for all calculations relevant to a single instant (i.e., some time "t") to be performed before any other operations take place. Only when the microscope response of each cell or element has been determined for time "t" are the results of the calculations made available for computing the responses at the next time step (i.e., at some t plus delta__t). As effective as this process is, the complexity of even a relatively simple problem (for example, the stamping of a simple pan-shaped object from sheet steel) whose physical realization might require but a second for completion may consume an hour of processing time on a super-computer.

An occasionally applicable alternative to the MPP approaches to computational modeling involves the use of networked computers of relatively more modest capabilities, each computer in the network functioning in essential autonomy and bearing responsibility for one specific case of importance. One can imagine hundreds or thousands of desktop systems, for instance, being employed during "off-hours" for the execution of a family of simulations, results from which would be subsequently gathered for further analysis and processing.

3. Overview of Invention

A particular embodiment of the invention as it is applied to the metal forming problem comprises the following elements described with respect to FIGS. 3A, 3B and 3C, and utilized as described in the paragraphs below.

A supercomputer 311, such as an ONYX, an Intel Paragon etc., is employed for the two preparation functions characteristic of the method. The more computationally intensive of these by far is the execution of the modeling code 312 from whose output neural network training data 313 are derived. When these data 313 are properly prepared, they are submitted for processing (training) by the neural network code 321 (described below) (possibly in combination with experimental data derived from laboratory or industrial apparatus).

The second function performed by the supercomputer 311 is to implement the neural network code 321 and, as noted above, carry out network training. For purposes of the present discussion, reference is made to the neural network 321, which may also implicitly refer to the supercomputer 311 (or other system) on which the neural network 321 may operate. Again, in one embodiment, the neural network 321 may comprise a backpropagation of error network.

The neural network 321 is responsible for learning the functional relationship(s) linking the independent and the dependent parameters of the presented shape-defining data sets 313, 314. In the case of the metal part stamping problem, the independent parameters are those describing the configuration(s) of a sequence of components to be stamped as well as the associated process parameters and material properties (313). The dependent parameters are those describing the configuration(s) of the corresponding sequence of dies earlier presented to the computational modeling code for generation of the component shapes (313).

It should be noted again that the neural network 321 is presented with data representing the "inverse" problem. That is, it is forced to learn what die configuration would have resulted in a specified part. The modeling code 312, of course, solved precisely the reverse problem. When the neural network 321 (or, in certain cases, the networks) is (are) fully trained, it (they) will be capable not only of reproducing the specific presented training examples, but of the much broader task (since functional relationships will have been captured) of predicting for an unfamiliar component configuration as well the configuration of a die capable of generating that configuration. Again, it is this generalization property of neural networks (i.e., the ability to capture functional relationships in complex data sets) that, when coupled with the "forward" modeling power of a supercomputer, is key to the new "inverse solution" method.

Finally, a desktop computer 331 (such as an IBM-compatible PC or a Macintosh) provides the mechanism whereby the computational, power of the supercomputer is made accessible at the level of readily available and inexpensive computing environments. Although neural network training may require hours of supercomputer time, the non-training execution of the same network consumes but milliseconds of processing time on quite modest systems. Thus, if provided with a suitable graphical user interface, the trained neural network 321 can support in seconds exploration of a breadth of parameter regimes whose full study would have required months or years on a supercomputer Although it is certainly the case that these more rapid studies will be characterized by somewhat less precision than would have obtained had the same studies been carried out in a supercomputing environment in the conventional manner (where such execution may be technically feasible), the capability for very rapid approximation of a "first pass solution" confers very great advantage and value.

Figures 3, 3A, 3B, 3C:
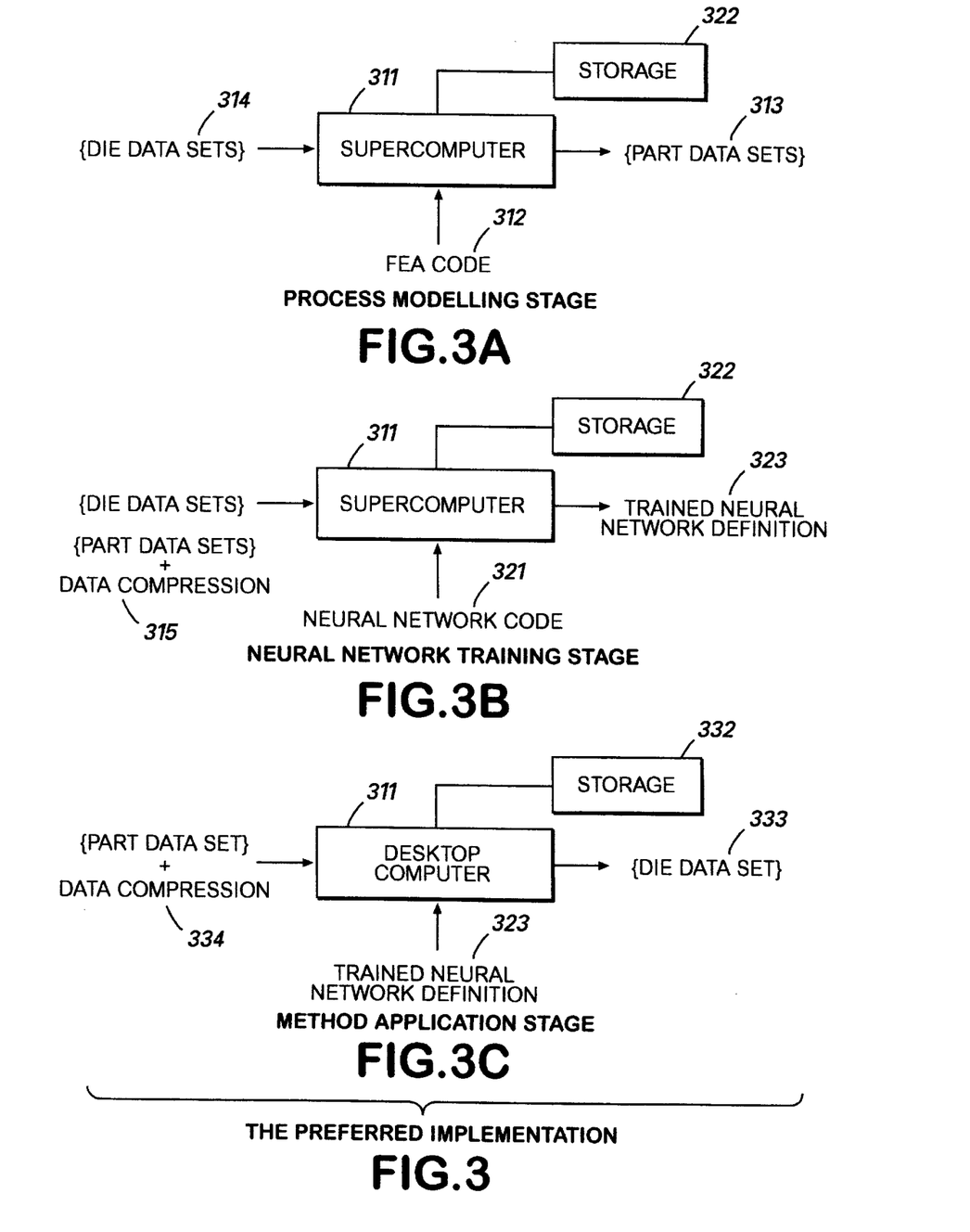
FIG. 3 depicts a block diagram of the overall system of the present invention.
Figure 4:
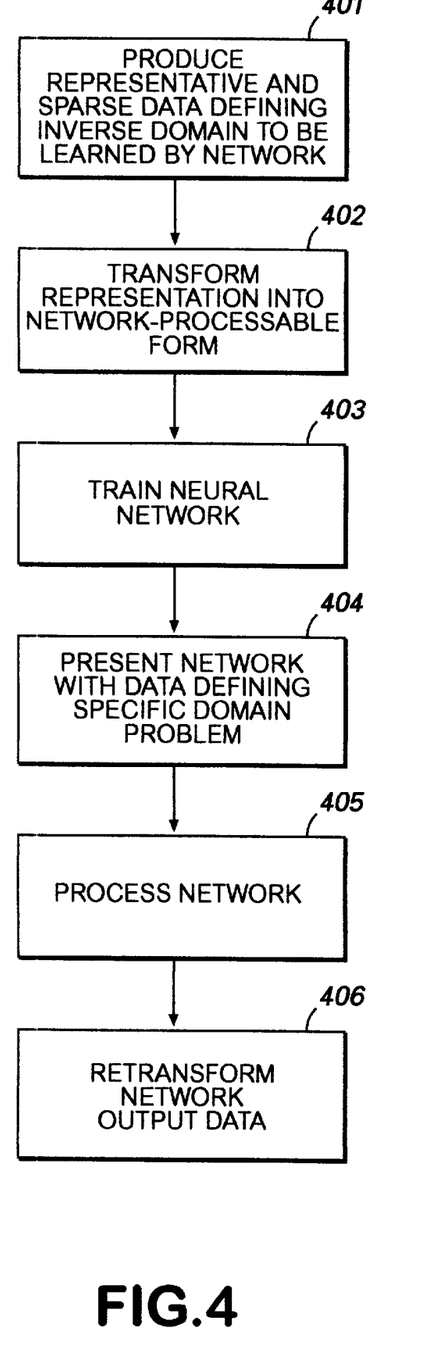
FIGS. 4–7 are flow diagrams showing the operation of the present invention.

The overall operational scheme for the method of the present invention described above with respect to FIGS. 3A–3C is defined in general terms by the six (6) steps noted below, with reference to FIG. 4. Reference numerals in [brackets] below refer to like-numbered reference numerals of FIG. 4:

[401] Produce a computable representation (or a set of representations) of the problem whose inverse solution is required and perform thereupon a series of supercomputer 311 computational modeling calculations for a sparsely distributed set of defining parameters spanning the ranges for which the inverse solution is required (see FIG 3A). Note again that the supercomputer 311 is solving the "forward" problem, not the inverse problem.

[402] Transform the data 313 resulting from the computational modeling studies into an appropriate representation for neural computation. In the case of the metal stamping problem, each of the "raw" data sets may include more than 4000 points. Neural networks in general perform best when presented with far more compactly represented data. For the stamping problem, the necessary compression (315 in FIG. 3B) (and the corresponding post-processing decompression) may be performed with either Fourier Transforms or Wavelet Transforms. In one variation of the method referred to as the "Patch Method", compression as such is avoided altogether by permitting the network to examine successive small patches of a component surface and thus to learn to predict directly, on a patch by patch basis, the differences between the contour of a presented component and that of the die that would produce it in a forming operation. So that "global" effects can be brought to bear on the "local" patch data, some patch network inputs are presented with long-range gradient information with respect to axes passing through the patch.

[403] Train the neural network 321 sufficiently to reduce the reconstruction RMS error to a value appropriate to the required accuracy (an RMS error value usually less than .01) (see FIG. 3B). Save the trained neural network definition 323 to storage 322, such as to a floppy disk.

[404] Load the network definition 323 onto the desktop system 331 via the floppy disk 322.

[405] Present the now-trained neural network 321 with transformed configuration data (in the non-patch case) for a desired component (shown as 334) to the desktop computer system 331 via a graphical user interface (GUI) or other means, and process the network (see FIG. 3C). Note that network outputs will comprise a transformed representation of a die configuration if the inputs comprise such a transformed representation of a part.

[406] Retransform the network output data (which, recall, will be, except in the patch case, in the form of a Fourier or Wavelet representation) in the desktop computer system 331 into a proper configuration representation (i.e., one in terms of x, y, z coordinates). The data resulting from retransformation of output data 333 define the required die conformation.

4. The Transformation and Retransformation Processes

As explained above with respect to FIG. 4, the transformation process of step 402 and the retransformation process of step 406 may be realized in at least three different embodiments, set forth below for illustrative purposes. The first implementation of steps 402/406 may utilize the two-dimensional Fourier Transform as the means for effecting the necessary data compression (315) of computational or experimental results (FIG. 3A). An advantage of the Fourier Transform compression method derives from the fixed and known relationship between the characteristics of the "spatial" components of a presented data set and the components defining the "frequency" domain representation of the transformed data. Thus, it is possible, a priori, to determine what level of truncation (or compression) is appropriate for a particular class of problem. Note that, once set, the truncation level must be maintained constant for all members of a part configuration class, so as to maintain a fixed network geometry.

The second implementation of steps 402/406 may utilize the two-dimensional Wavelet Transform as the data compression (315) mechanism. Although capable of somewhat greater levels of compression (and thus leading to neural networks of fewer input and output nodes), the relationship between the characteristics of the "spatial" components of a presented data set and the components defining the "scale" domain representation of the Wavelet Transform is somewhat more difficult to manage computational. Thus, an a priori determination of truncation limits is, although possible in principle, much more difficult to realize in practice than for the Fourier case. The solution adopted for effecting this determination involves an "on-the-fly" construction of a mapping between the components of the Wavelet Transforms for each of the presented data sets and the input and output nodes of the neural network (whose construction must now await completion of this mapping for all data sets). It should be noted that the necessity of constructing such a mapping limits the application of the method to component and die shapes of the same general "scale sizes" as those which characterized the components employed for network training. Again, once a mapping and the truncation limit leading to it are determined, they must be maintained for all subsequent applications of a given trained network.

The 2D Wavelet compression method derives its utility from the fact that a very small fraction of the total number of wavelet components (perhaps one or two percent) can represent a three-dimensional shape with considerable fidelity (a fidelity more than sufficient for the die prediction purposes). For a reasonably narrowly defined set of shapes, the identity of these important components will be fairly consistent across all members of the set with variations among set members being represented principally in amplitude differences among the important components. Substantive variations among set members will be represented by the appearance of dominant wavelet components more or less singular to the set members bearing those variations. It is the combination of consistent and singular components that must be captured and represented to the network for subsequent processing. Key issues then are identification of these components and preparation of a mapping relating them in a consistent manner to network input nodes.

Although it is, in principle at least, possible to pre-compute the locations within the wavelet array most likely to represent significant contributions to a particular two-dimensional shape definition, it has proved considerably simpler in practice to identify these locations "by inspection" of the part and die definitions pertinent to a particular class of shapes as these definitions are read by the computer. The full specification of significant wavelet components is thus incrementally constructed as each shape and die file is examined in the context of the associated wavelet transform.

Figure 9A:
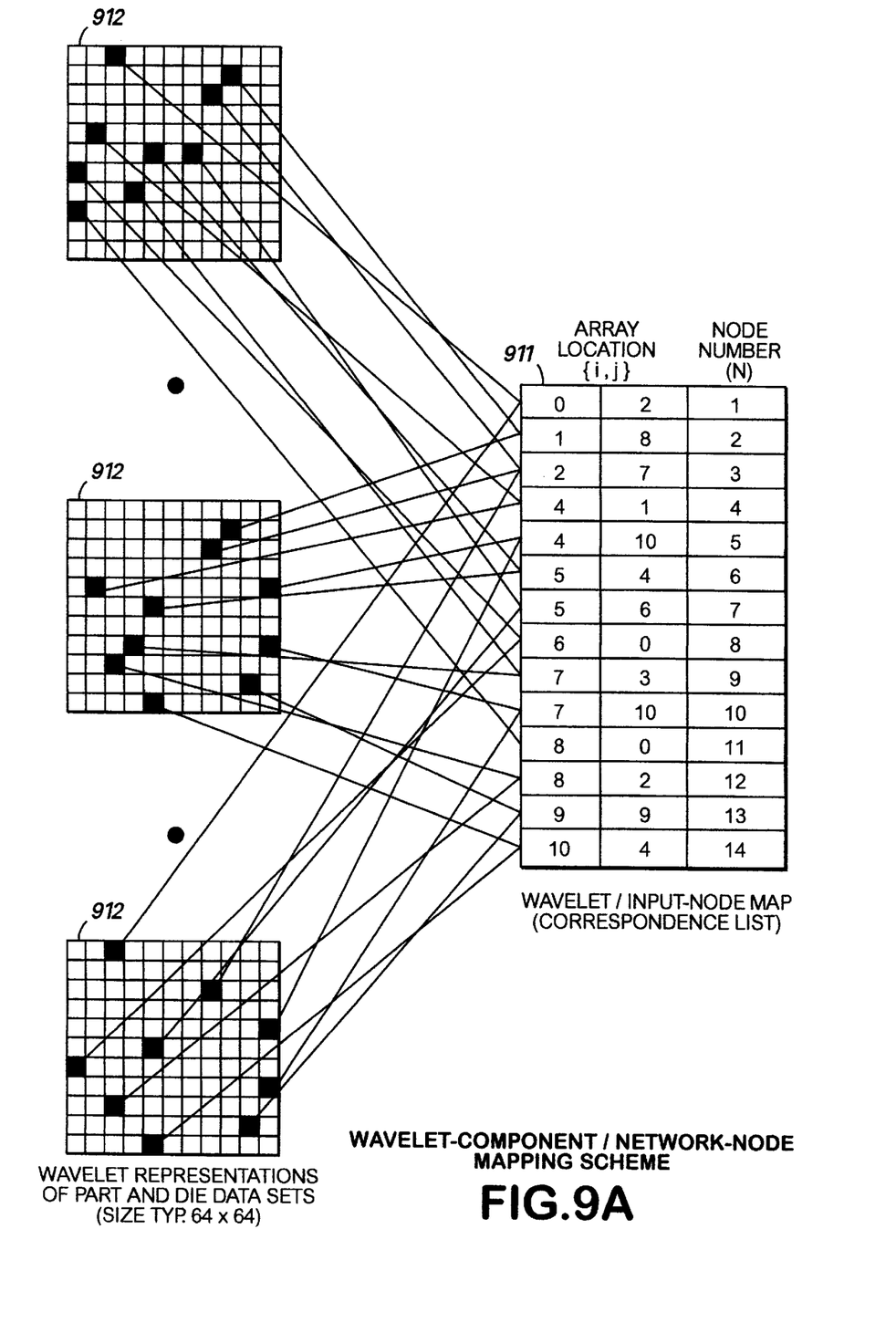
FIG. 9A shows the relationship between wavelet-component data sets and a mapping of the data sets.

The specification itself takes the form of a list of discovered wavelet array locations (those locations for which the wavelet component value exceeds some preset magnitude) and the network nodes to be associated therewith. Construction of the specification (or map) proceeds according to the pseudo-code prescription sketched below and illustrated in FIGS. 9A and 9B. The reference numerals listed below in [brackets] refer to like-numbered steps depicted in FIG. 9B. Reference numerals without [brackets] refer to like-numbered elements of FIG. 9B.

Figure 9B:
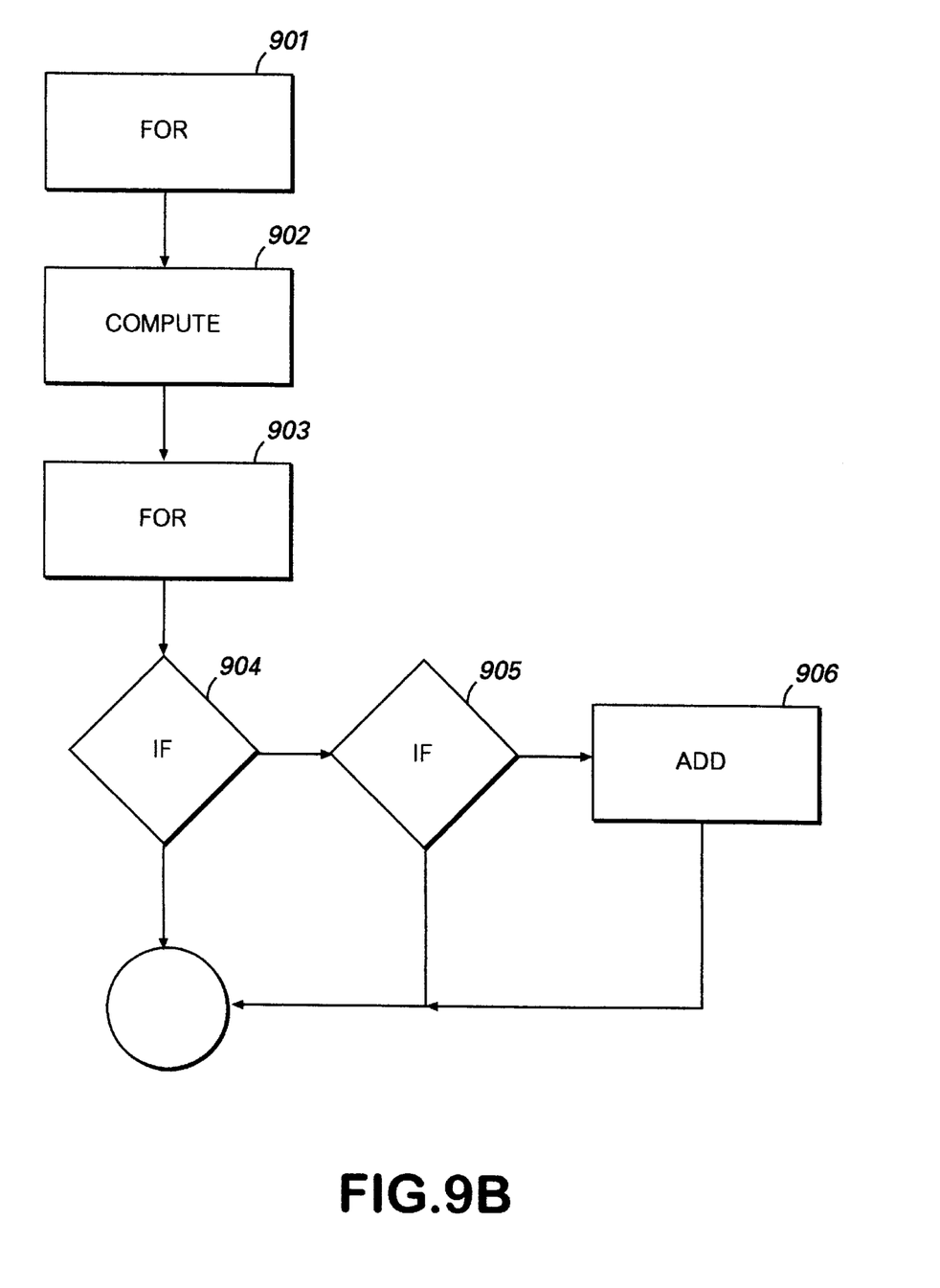
FIG. 9B is a flow diagram depicting the operation of the mapping of FIG. 9A.

```
[901] For(each part and die file)
    {
    [902] Compute 2D Wavelet Transform;
    [903] For(all wavelet array locations { i, j } 912)
        {
        [904] If(wavelet magnitude greater than threshold)
            {
            [905] If(location { i, j } not on map 911)
                {
                [906] Add location { i, j } to map 911;
                }
            }
        }
    }
```

During system execution, the just produced map 911 can be employed by the network code to identify the wavelet array elements 912 from a presented part or die specification (the latter during network training) to be communicated to the network for processing. After processing, the map 911 can be employed for identifying wavelet locations into which to insert network-computed values prior to the retransformation operation. Note that there will inevitably be entries in the map 911 for which the corresponding wavelet array element is insignificant for some presented shapes. Nevertheless, once constructed, the map 911 must be employed as generated to extract from each presented shape the indicated wavelet array components. Moreover, once constructed and associated with a particular network, the map 911 must be saved with the trained network definition (323 in FIG. 3) and thereafter employed with that, and only that, network definition.

The final implementation of steps 402/406 utilizes the earlier-referenced Patch Method for data representation and compression (315). Of the three approaches, this one confers the greatest capacity for capturing in the network 321 the physical relationships connecting a part conformation and the conformation of a die that would form the part since, relative to other methods, little information is lost in the compression process. Operation of the "Patch Method" is predicated on the reasonable assertion that shape gradients near a point on a material surface are more likely to influence the response of material at that point to deformation forces (imposed, for instance, by a punch and die) than are shape gradients at positions more removed from the point. Equally reasonable is the assertion that "near" effects must be represented more completely to the neural network than more "distant" ones if the network is to capture the important metal forming relationships.

Figure 8:
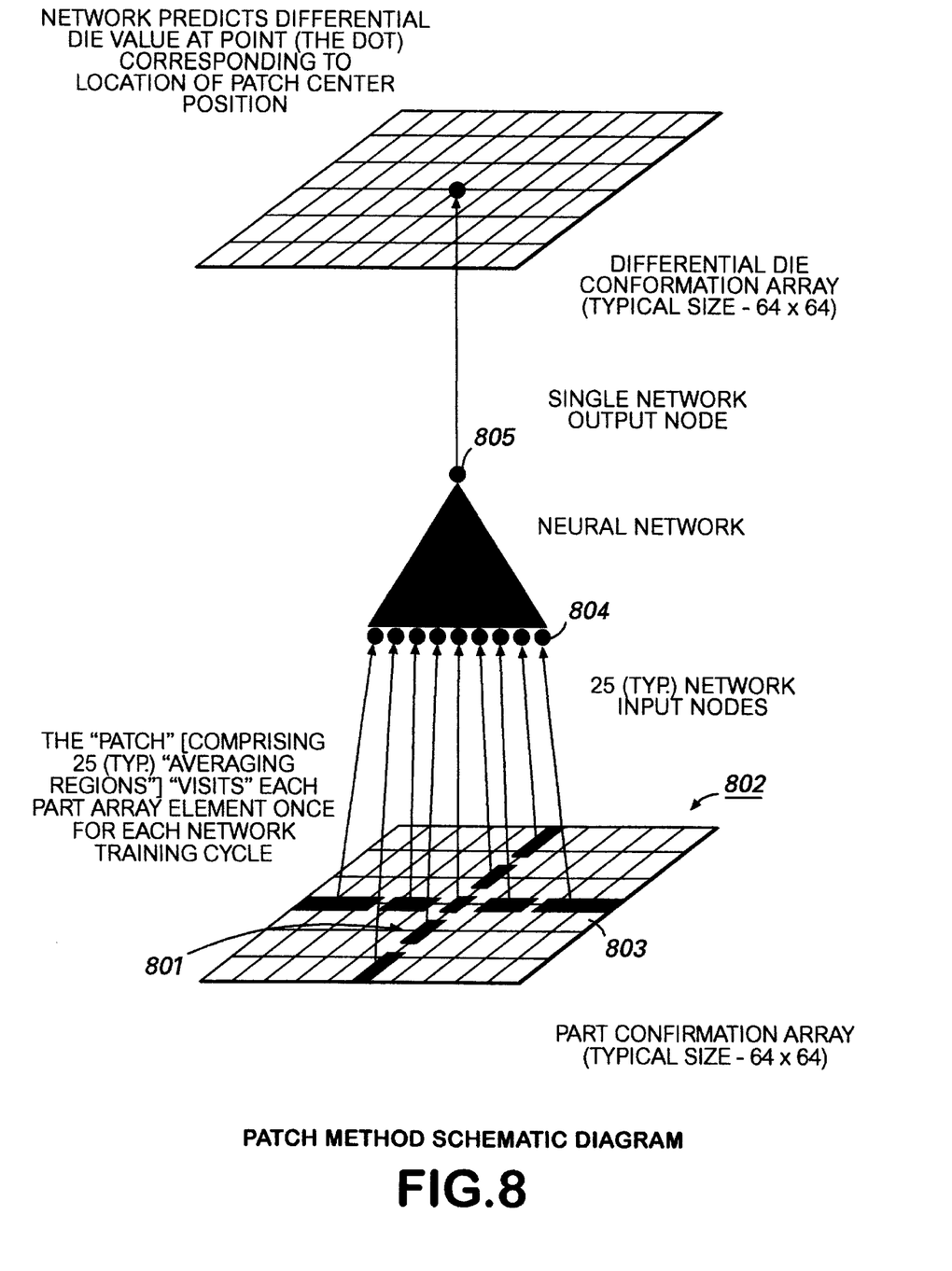
FIG. 8 is a perspective view of the present invention implemented with the patch method technique.

With reference to FIG. 8, the Patch Method operates such that a fixed pattern (or patch) 801 of "averaging regions" is scanned over the data array 802 representing a material part (typically a sheet-metal component) of interest. In a typical implementation, a patch 801 may comprise 25 averaging regions 803 of graduated sizes (12 per axis and one central element, the smallest, central element, being one array element square, the largest of the order of 8 to 10 array elements in length and one array element wide) comprising a cross shaped region 801 of the general form suggested by the schematic representation of FIG. 8. These averaging regions are distributed along orthogonal axes (axes typically defined by the length and breadth of the part) and comprise in each axis such a total length that, whatever the position on the part array of the central averaging region (itself subsuming, in the usual case, exactly one array element), the full extent of the part along an axis is covered by averaging regions along the same axis (note that, in the usual case, elements of averaging regions extending past the part array boundary are filled with zeros). For each averaging region size (one of 5 array elements, for instance), it is arranged that a corresponding number of part data (5, for the just noted example case) are averaged and represented by the averaging region to a corresponding network input node 804 by the computed average value. Because network training is a highly iterative process, it is arranged in practice that the average values are computed but once during system preparation and stored for efficient retrieval in computer random access memory.

The training goal for a network employing the Patch Method of data representation/compression is to produce at a single output node 805 a signal representing the value of the difference between part elevation and corresponding, die elevation at that point for each position on the part array. From these differences, the true die configuration can be trivially derived by pointwise addition.

The Patch Method confers the advantage that a much more accurate representation of the part surface is retained in the data employed by the network than is the case with either the 2D Fourier or the 2D Wavelet data compression methods. The penalties paid for realizing this advantage are two in number. First is the requirement that the network "visit" each of the elements of the part definition array may times during training. For the typical 64×64 case noted here, there are 4096 such elements, each of which may be visited several thousand times during a typical training session. The second penalty is the memory intensive character of the method. For each of the 4096 potential patch-center locations, it is necessary to store the 25 average values (for a total of 25*4096, or 102400 values) for each data set to be processed by the network (of which there may be hundreds). Nevertheless, where memory size and processing speed are not of concern (as in the case of the preferred Supercomputer implementation), these are inconsequential issues.

In operation a patch-based network is prepared bearing a number of input nodes equal to the sum of the number of "geometry" data components, the number of process parameters, and the number of material parameters. Of these, only the "geometry data change as the patch (which may be viewed as a sort of "window") is scanned over the entire surface of the component presently serving as the source of input data. Again, these data represent the behavior of the component surface along orthogonal axes extending to the component edges.

It bears reiterating that when a patch network is fully trained, it will have captured physical relationships relevant to configurations of a broad range of globally-influenced local geometries even when exposed to a relatively sparse distribution of component and die shapes. Thus, the method is far more broadly applicable than either of the two transform-based methods. It may also, as a result of this generality, prove slightly less accurate in its predictions than the transform methods.

In a variation of the original patch definition scheme, the compression capabilities of either the Fourier or Wavelet transforms, now in one-dimensional form, have been employed to redefine the patch region. Under the new scheme, the patch is taken to comprise a selected few elements (8 to 16 or so) of either the Wavelet or the Fourier transform of the part array data array row and column vectors corresponding to the current position of the patch center point. The principal advantage conferred by the new method is a capability for controlling more precisely the degree to which various conformation characteristics contribute to the network prediction of differential die values. The practical result is a reduction in the number of network input nodes required for a given level of prediction accuracy.

Example Application of the Invention

As described previously, the development of specifications for a die intended for the production of newly designed sheet metal parts (car fenders, pans, containers of all sorts, etc.) is one of the more difficult and time-consuming tasks of modern industry. It is not uncommon, for instance, for the design process for a relatively simple part to require several refining iterations, for each of which the expense is considerable. Even relatively simple variations in the specification of the part can require compete re-evaluation of the design process.

One of the principal difficulties arises in connection with a phenomenon known as "springback"—the response of a newly stamped part to internal material forces leading the part to assume a shape somewhat different from that of the tooling with which it was formed. Although iterative computations can ultimately lead to a die configuration whose resultant part will be of the desired conformation, the computational modeling process is time-consuming and of limited utility since the results are in general not extensible. The method and system defined by the present invention can be employed both to simplify the long-term processes of die design for parts of some desired class (e.g., car fenders) as well as to reduce to one, or at most a few, the number of iterations required for the development of a particular die design.

Figure 5:
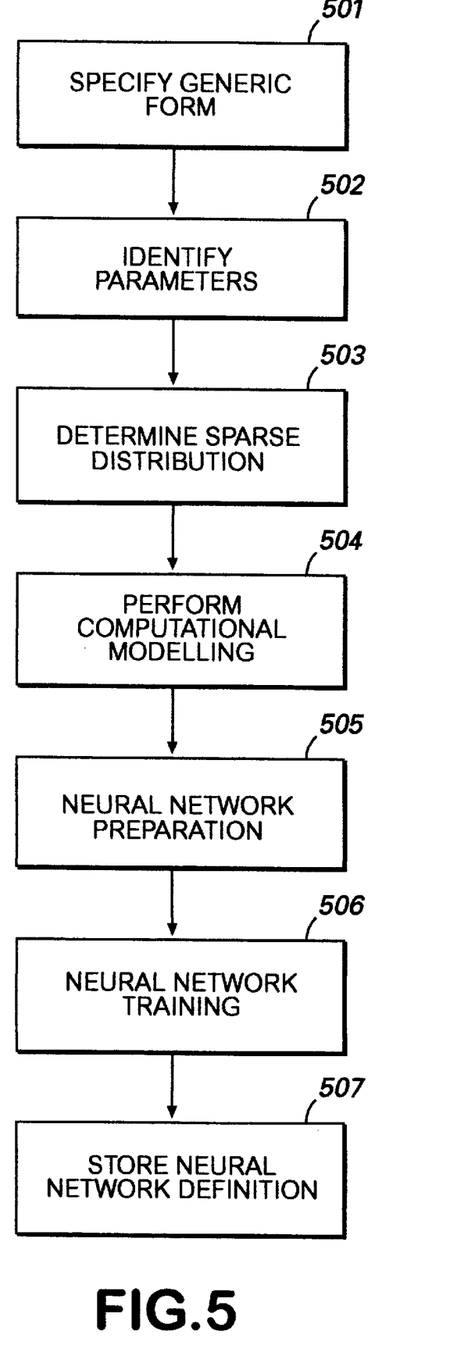
Figure 6:
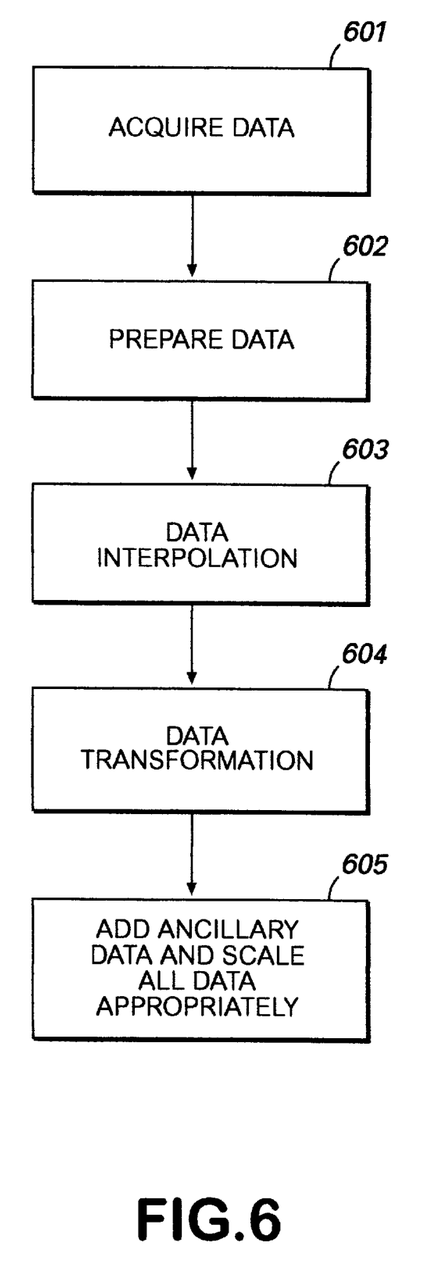

The application of steps 401–406 of FIG. 4 to the die design task example is described below with respect to FIGS. 5 and 6. Reference numerals in [brackets] below refer to like-numbered reference numerals of FIG. 5:

[501] The physical process to be modeled is the production of stamped metal parts from appropriately formed dies. In the usual case, a specific generic form (pan, hat, fender, etc.) would be specified.

[502] The relevant parameters are of two classes -- those defining the stamping process and those defining the material to be stamped. The appropriate ranges in the parameters are determined by consideration of known limits on the stamping process to be employed and the material properties (both physical and "mechanical") of materials likely to be of interest. In practice, matters are somewhat simplified by the relatively limited range of materials employed for metal part stamping.

[503] The appropriate sparse distribution in the defining parameter values of step 502 is determined by considerations of parameter ranges, desired final accuracy of the subsequent network training process, and available processing time for modeling. In general, higher ultimate accuracy of network prediction will require more modeling examples on which to base the ensuing network training.

[504] The computational modeling for the example case involves simulation of the die stamping process (for the present case, using a standard FEA code 312) for each of the data sets defined by step 503. It is important to note that it is not necessary, or even desirable, for any single one of the sparsely distributed data sets to correspond precisely to the part or parts whose formation is the ultimate goal of the modeling/neural network activities. What is important is that the computational modeling yield data sets each associating a part conformation with the corresponding die conformation that would in practice produce it under a specified set of stamping conditions. Steps 501–504 correspond to step 401 in the overall operational scheme depicted in FIG. 4.

[505] Neural network preparation for the present example application represents the most critical step in the overall procedure. Consideration of the training goal for the network suggests a potential problem. If the network is to be capable of computing the three-dimensional shape of a die suitable for producing a specified part shape under a specified set of stamping conditions, it is apparent that the network must be capable of processing data sets representing (in addition to the defining material and process parameters) the distribution of points in three-dimensional space. The requirements thus imposed in regard to network size (thousands of input and output nodes!) are formidable and practicably unrealizable. Two approaches to data compression (the Fast 2D Fourier Transform and 2D Wavelet Transform together with their corresponding inverses) have been employed with success in the attempt to reduce network size to something manageable. Also applied with success (and much greater ultimate and general potential) is a scheme in which a very much smaller network surveys corresponding "patches" in the data sets representing part and die configurations and learns to reproduce the latter in piecewise fashion from the former as a function of position, scale, and process parameter values. In any case, whatever the method chosen for data representation/compression, a network is generated (by standard means) capable of accepting shape-defining data, process data, and material property data as network input and die-defining data as the network training-goal definition. Step 505 corresponds to step 402 in FIG. 4.

[506] For the present static case, neural network training proceeds in the standard manner in the context of the data sets of step 504 and continues until the prediction error for all members of the training data set has dropped below some predetermined threshold During network training, and particularly when training is complete, the network is analyzed in the context of data not presented as part of the training set in order to evaluate the performance of the trained network in the context of its intended use. Step 506 corresponds to step 403 in FIG. 4.

[507] When trained to the prescribed degree, the network definition 323 resulting from step 506 is stored on disk 322 for subsequent distribution to (via storage 332) and execution on desktop computing systems 331.

6. Implementation Details of Invention

A metal die design process must begin, as would the treatment of any other inverse problem subjected to the teachings of the present invention, with careful preparation of training data for the neural network 321/311 (or networks, if multiple networks are to be processed for subsequent selection of a "best" performer). Again, the training data may include computational modeling results obtained using a supercomputer (see FIG. 3A) as well as experimental data derived from laboratory or industrial equipment. In either case, it is important that data be obtained in a form that will subsequently lend itself most felicitously to any process of data compression (e.g., step 402 of FIG. 4) that may be employed.

The data representation must also adhere to a conformation requirement imposed by the nature of the employed neural network(s) (i.e., a neural network employed for "image" learning should "expect" its input nodes to represent a regular, repeating, pattern of data organization, most often a pattern in the form of a rectangular array or grid of points). Rectangular regularity of data is likewise required by two generally employed data compression schemes (Fourier Transform and Wavelet Transform, for which proper operation requires, in addition, that data sets bear characteristic dimensions (row and column lengths) expressible as some power of two).

For a typical case, die and component representations (arrays) are 64 by 64 elements (or pixels) in size. In those cases for which the required regularity and size requirements are not met, some form of interpolation is applied to the data before proceeding. It bears noting in this regard that the results of most computational modeling studies, although they may begin with data distributed on a regular array (usually called a "mesh" in modeling jargon), do not maintain the structure of the mesh, but redistribute it as required by the nature of the ongoing, computations. It is important that this effect be compensated for in order to ensure proper data compression and network operation.

Because the efficiency of subsequent network generalization of the presented data depends upon the breadth of network exposure, as much computational modeling should be performed and as much experimental data (which, note, must be of the same form and include the same numbers and types of data as the computational results) should be collected as possible. At the same time, the generalization capability of the network makes it unnecessary to "fill in all the chinks". By no means must every combination of parameters be presented to the network during training (the method would be useless were this otherwise!). It is, nevertheless, essential that the sparse distributions in the various parameters include, among others, values near, if not at, the extreme likely to be encountered during subsequent non-training application of the system.

The implementation details of the present invention in one embodiment are described in further detail below. In one embodiment, all the neural network code may be written in the programming language "C", including appropriate graphic utilities, file readers, neural network algorithms, etc. Standard "C" libraries, known to programmers having ordinary skill in "C" programming, may be employed. Such libraries are included in virtually all implementations of the "C" programming language. Where appropriate, the names of certain key high-level functions (as named in one embodiment) are given in the following description.

When all data have been generated or otherwise obtained (steps 401–402 in FIG. 4, and steps 501–505 in FIG. 5), the data are submitted to the neural network program 321/311 for training (step 403 and step 506). If the selected compression method is the Wavelet Transform, the program named DieShapeNN_WT Del is used for network training. As this program executes, it performs the operations noted below as it prepares the raw modeling and/or experimental data for network utilization.

The training of the neural network is described in further detail below with respect to FIG. 6. Reference numerals in [brackets] below refer to like-numbered reference numerals of FIG. 6:

[601] Acquire the data from the files 322 produced during modeling and/or experimental data gathering (step 401 and steps 501–504). This is the responsibility of the high-level function AcquireDieAndShapeData. This function calls three others which read general header data, part-defining data, and die-defining (or differential die-defining) data (ReadInfoData, ReadShapeData, and ReadDelData) from storage 322. Because the number of data of various types to be read is not necessarily known in advance, the latter two of these functions may acquire data in the form of linked lists, the entries of which are later re-represented as conventional two-dimensional arrays of binary size. Such use of linked lists constitutes standard programming practice known to an ordinarily skilled computer programmer.

[602] When all data have been acquired, the high-level function, AcquireDieAndShapeData, calls, as its final activity, the multi-purpose function AssembleAndNormalizeData. The primary task of this routine is to prepare the data in such a manner that they are expressed in the context of a rectangular (square) array of binary size (64 by 64 in the present implementation). Before undertaking this operation, various checks of data consistency are performed in order to ensure that subsequent preparation operations will not fail. For example, some of these checks pertain to "material property" and "process parameter" values and are intended to ensure that data of the same types are present for all cases and that they are expressed in the same units.

[603] If consistency is found, execution continues with a call to PrepareShapeData. It is finally here that data transformation begins. Raw data for both part and die (or, in the more usual case, for the differential die representation) are subjected to interpolation operations to ensure representation in the required regular rectangular manner. The interpolation scheme employed is a form of two-dimensional curve fitting by which the non-uniform mesh of the computational modeling data is transformed into a uniform rectangular mesh.

[604] Next, data of both types are subjected to the two-dimensional Wavelet Transformation process (or, if appropriate, to the two-dimensional Fourier transformation or the Patch Method reduction). Transformation results are truncated and, via the function AddToSourceList, associated with an incrementally constructed map relating Wavelet positions of high amplitude to neural network nodes (or, more precisely, since the network is not yet constructed, to linked list elements subsequently to be associated with network nodes). Storage in random access memory of those data to be maintained for subsequent processing is effected by StoreWaveletComponents. Unused data are discarded in the interest of minimizing memory requirements.

[605] Finally, the function AddFormingAndMtlData adds to the input conformation data (i.e., the part-defining data) the values for process parameters and material properties. On successful return to AssembleAndNormalizeData, a call to the function NormalizeData scales all data into a range {e.g., 0.2 -> 0.8} appropriate for presentation to the neural network input and output nodes.

So as to suggest the general manner of data representation, the principal C programming language structures involved in data preparation for a program based on the Wavelet Transform compression method are noted below in Table 1. Observe that structures of the first two types are referenced by structures of the third type and that all three structure types are intended for storage in the form of linked-lists.

TABLE 1

```
typedef struct {
    char            *ParmName;
    double          ParmValue;
    void            *Next;
}FormingProcessInfo;
typedef struct{
    char            *ParmName;
    double          ParmValue;
    void            *Next;
}MaterialPropInfo;
typedef struct{
    Boolean         ExciseFlag;
    Boolean         TrainFlag;
    int             **X;
    int             **Y;
    int             NumRawPartData;
    int             NumRawDeltaData;
    char            *InfoFileName;
    char            *PartFileName;
    char            *DieFileName;
    double          VHAspect;
    double          ZHAspect;
    double          ZVAspect;
    double          *NetDeltaData;
    double          *NetPartData;
    double          **NetOutput;
    double          **PartShapeData;
    double          **Delta0ShapeData;
    double          **RawPartDataPtr;
    double          **RawDeltaDataPtr;
```

TABLE 1-continued

| | |
|---|---|
| FormingProcessInfo | *FormProcPtr; |
| MaterialPropInfo | *MtlPropPtr; |
| void | *Next; |
| }DataHeaderList; | |

Details relevant to the general methods employed for network representation and on-the-fly network modification are suggested by the following five structure definitions in Table 2.

TABLE 2

| | |
|---|---|
| typedef struct{ | |
| double | Wt; |
| double | LastWt; |
| double | SaveWt; |
| double | DeltaWt; |
| void | *SourcePE; |
| }WtData; | |
| typedef struct{ | |
| Boolean | CPEFlag; |
| Boolean | ExciseFlag; |
| int | X; |
| int | Y; |
| int | Size; |
| double | Output[2]; |
| double | LastOutput; |
| double | Error; |
| int | Pt3[3]; |
| WtData | *WtStart; |
| WtData | *WtEnd; |
| }PEData; | |
| typedef struct{ | |
| Boolean | StartFlag; |
| double | OutputMax; |
| double | OutputMin; |
| }PEExtrema; | |
| typedef struct{ | |
| int | NumPE; |
| int | NumCPE; |
| PEData | *BiasPtr; |
| PEData | *PEPtrl; |
| PEData | *EndPEPtr; |
| }LayerData; | |
| typedef struct{ | |
| Boolean | StartFlag; |
| Boolean | TrainFlag; |
| int | NetworkType; |
| int | NetNumber; |
| int | nLayers; |
| int | SumPE; |
| int | CPEGroups; |
| int | CPEOffset; |
| int | NumWts; |
| int | ErrorCount; |
| int | TrainCycles; |
| int | SettleCycles; |
| long | Iterations; |
| long | LastIterations; |
| long | TotalIterations; |
| double | Mom; |
| double | Lambda0; |
| double | CurrentLambda; |
| double | AlphaMax; |
| double | AlphaMin; |
| double | TotalError; |
| double | LastTotalError; |
| double | SmallestTotalError; |
| double | RunningError[kRunningErrorLen]; |
| double | *Error; |
| LayerData | *LayerPtr0; |
| LayerData | *LayerPtrD; |
| PEData | *PEPtr0; |
| WtData | *WtPtr0; |
| WtData | *EndWtPtr; |
| Str255 | NetWinTitle; |

TABLE 2-continued

| | |
|---|---|
| CWindowPtr | NetWinPtr; |
| Rect | *NetWinRect; |
| }NetworkData; | |

Important characteristics of a broad spectrum of programs of the general class employed for solution of "Inverse" problems is suggested by the single "Global" structure definition reproduced below in Table 3). Note that this structure references both network definitions and data definitions and controls their proper construction and utilization whatever the type of data compression employed.

TABLE 3

| | |
|---|---|
| typedef struct{ | |
| Boolean | AutoSaveFlag; |
| Boolean | DitherFlag; |
| Boolean | ListFlag; |
| Boolean | PlotFlag; |
| Boolean | PrintFlag; |
| Boolean | RandDataOrderFlag; |
| Boolean | RandomSetupFlag; |
| Boolean | SoundFlag; |
| Boolean | TrainFlag; |
| Boolean | FourierFlag; |
| Boolean | PatchFlag; |
| Boolean | WaveletFlag; |
| int | GeomPEIndexLim; |
| int | OutputEdge; |
| int | NumProcParms; |
| int | NumMtlProps; |
| int | NumPatchInputVal; |
| int | NumPatchPredictedVal; |
| int | NumNetworks; |
| int | NumDataSets; |
| int | EpochLength; |
| int | RMSCursor; |
| int | LastRMSCursor; |
| int | LastPenIndex; |
| int | RMSErrorLen; |
| long | EpochCount; |
| long | *IJIndex; |
| long | *RandData; |
| double | MaxPartQQ[3]; |
| double | MinPartQQ[3]; |
| double | MaxDelQQ[3]; |
| double | MinDelQQ[3]; |
| double | ADeltaNorm; |
| double | BDeltaNorm; |
| double | APartNorm; |
| double | BPartNorm; |
| double | AXNorm; |
| double | BXNorm; |
| double | AYNorm; |
| double | BYNorm; |
| double | *AProcNorm; |
| double | *BProcNorm; |
| double | *AMtlNorm; |
| double | *BMtlNorm; |
| double | *ProcMax; |
| double | *ProcMin; |
| double | *MtlMax; |
| double | *MtlMin; |
| double | **RMSError; |
| double | **ReconstructionError; |
| char | *FileListName; |
| char | *DelDataPathName; |
| char | *DieOutPathName; |
| char | *InfoDataPathName; |
| char | *NetDataName; |
| char | *NetPathName; |
| char | *PartDataPathName; |
| char | *SaveNetwork; |
| ListElement | *NetDataPtr; |
| DataRecordArray | *DataArrayPtr0; |
| NetworkData | *NetPtr0; |

TABLE 3-continued

| | |
|---|---|
| TempData | TheTempData; |
| Rect | *DieShapeRect; |
| Rect | *DieXSectionRect; |
| Rect | *GenPurposeRect; |
| Rect | *PredictedDieRect; |
| Rect | *PartShapeRect; |
| Rect | *PartXSectionRect; |
| Rect | *RankRect; |
| Rect | *RMSRect; |
| Rect | *ScatterRect; |
| Rect | *WeightDRect; |
| Rect | *WeightVRect; |
| CWindowPtr | DieShapeWindow; |
| CWindowPtr | DieXSectionWindow; |
| CWindowPtr | GenPurposeWindow; |
| CWindowPtr | PredictedDieWindow; |
| CWindowPtr | PartShapeWindow; |
| CWindowPtr | PartXSectionWindow; |
| CWindowPtr | RankWindow; |
| CWindowPtr | RMSErrorWindow; |
| CWindowPtr | ScatterWindow; |
| CWindowPtr | WeightDWindow; |
| CWindowPtr | WeightVWindow; |
| }GlobalData; | |

When the data have been acquired, normalized, and otherwise made ready for network operation, it is the task of the function BuildNetworks to construct one or more neural networks of such characteristics as may be directed by the nature of the data. Although certain network parameters are left to the discretion of the user, the code must arrange that all networks bear a number of input nodes equal to one plus the sum of the number of preserved Wavelet part components (or Fourier components or Patch components when the associated compression methods are employed), the number of process parameters, and the number of material parameters. The number of output nodes must be precisely one plus the number of preserved Wavelet die (or, more generally, differential die) components (or one plus the number of preserved Fourier components if Fourier compression is employed, or one plus one if the Patch compression method is employed).

When all neural networks have been prepared (again, there may be but one—the choice is the user's), the user may cause the networks to be trained (step 403/step 506) sufficiently to reduce the reconstruction RMS error to a value appropriate to the required accuracy (an RMS error value usually less than 0.01). If the neural network code 321 is executing on a supercomputer 311 the time required for training ill be no more than a few minutes, in one embodiment. If a typical desktop computer 331 is employed, the training process may take days. Note that during the training process it is possible to monitor system behavior by taking advantage of any or all of the provided graphical utilities. Among the more useful of these are Draw3DErrorMap (a perspective representation of the disparity between network die prediction and true die shape). DrawXSecShape (a two-dimensional or "side view" form of the 3-D error map). PlotError (network output node RMS error), and PlotScatter (standard scatter diagram for network output nodes).

Figure 7:
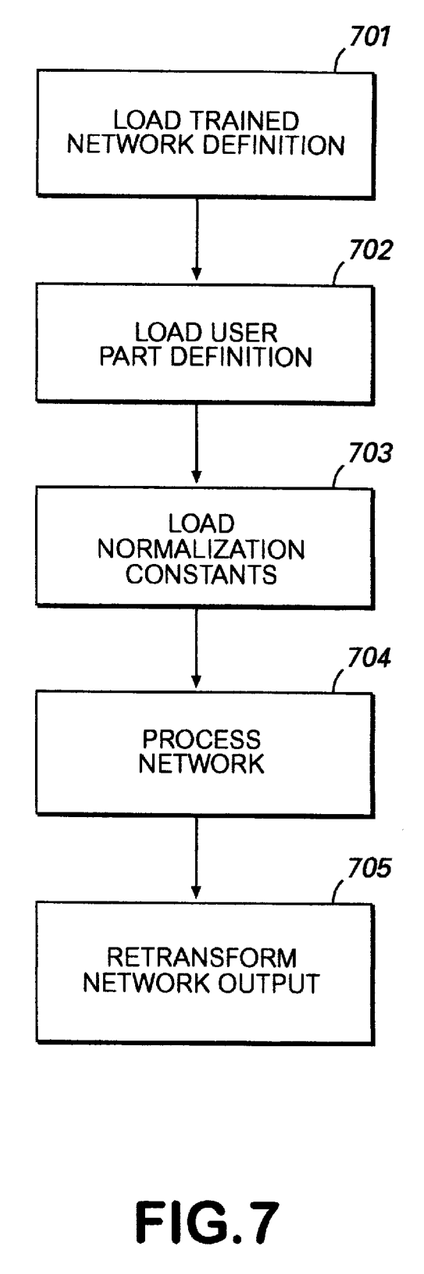

When the network is finally trained, it is at last ready for use by the end-user—in the die example case, the die designer with a desktop computing system 331. FIG. 7 describes the steps that may be performed by the user of the desktop computer system 331. Reference numerals in [brackets] below refer to like-numbered reference numerals of FIG. 7:

[701] The user may load on his computer 331 a file from storage 332 bearing the trained network definition 323 created by supercomputer 311 on storage device 322. The trained network definition is, in effect, a "weight" or connectivity list.

[702] The user may also load into the desktop computer 331 the values for the compression normalization constants earlier created during network training, the Wavelet component map (if the system in use is DieShapeNN_WT Del), and values for a few other system-defining parameters (Folder names, etc.). Where these are required they are supplied automatically or prompted for.

[703] It is then necessary only to provide the now-trained neural network with transformed configuration data for a desired component by invoking the same loading operation described above in connection with network training. The code will skip AddToSourceList in this non-training mode of operation (again, assuming that the system in use is DieShapeNN_WT Del) since it will have read the Wavelet component map now known to be appropriate to the network and the general component class.

[704] The network may thereafter be processed by the user (e.g., by selecting Run -> Test from the File GUI menu).

[705] Upon completion of the single network iteration on the desktop computer 331, the values of the signals appearing at the network output nodes will comprise a transformed representation of the desired die configuration (i.e., the die configuration corresponding to the user-supplied part definition [703]). The code may automatically retransform the output signals into a proper configuration representation (i.e., one expressed in terms of x, y, z coordinates). The resulting data define the required die conformation. These can be saved on a file on storage device 332 and submitted to a die fabrication shop for final realization of the die.

It bears mentioning that, given the appropriate graphical use interface, the code may be employed in a somewhat more "user-friendly" manner than that suggested above. Thus, if the output of a graphical design tool is coupled directly to the pretrained neural network system, it is possible for a user to draw a part on a computer screen and, within milliseconds, see, in an adjoining graphical window, the die which would be required for fabricating the part. Indeed, it is in this general mode of operation that most users of the inverse solution method of the present invention may choose to implement the invention.

7. Advantages of the Invention

The single greatest advantage of the new method and system of the present invention, in particular when used to address the metal stamping problem, is the expanded abilities it grants to the die and part designer. By using the present invention, the designer can bring to bear with the click of a mouse much of the power of the computational resources of the world's fastest supercomputers. For the metal stamping application, the present invention translates into a "per-die" savings of tens of thousands of dollars per design iteration (of which, in the classical die design mode, there may be as many as a dozen). The ability to reach very quickly a close approximation to a solution saves not only in terms of direct design cost, but days or months of expensive computational effort as well. Since supercomputing time can be very substantially minimized if reasonable starting configurations are known, even a crude first approximation produced by the neural network can confer great advantage.

The general teachings of the present invention have been described with respect to one application of the invention—metal stamping. It will be readily understood by those of ordinary skill in the art that the present invention has many uses outside of the metal stamping and design arts, and that this application has been described for illustrative purposes only.

We claim:

1. A system for generating parameters characterizing a first physical object, wherein the first physical object is adapted according to a specified transformation process so as to modify a second physical object, the system comprising:

(a) means for generating a plurality of sets of training parameters, each set of training parameters characterizing:
 (i) a sample second physical object,
 (ii) the specified transformation process that results in the sample second physical object, and
 (iii) a sample first physical object that interacts with the specified transformation process so as to modify the sample second physical object;

(b) means for operating a neural network;

(c) means for applying the plurality of sets of training parameters to the neural network so as to train the neural network, wherein each of the plurality of sets of training parameters is processed by the applying means over a plurality of patches, each patch comprising a data array, two orthogonal axes crossing the data array and a plurality of regions along the axes, so as to provide at least one single output node by averaging over the plurality of regions without losing information contained in the data array, thereby producing a network definition associated with the trained neural network;

(d) means for storing the network definition;

(e) means for generating a set of second parameters characterizing the second physical object; and (f) processing means for generating a set of first parameters characterizing the first physical object based upon the set of second parameters and the network definition stored by the storing means.

2. The system of claim 1, further comprising means for creating the first physical object based upon the set of first parameters.

3. The system of claim 1, wherein the first physical object comprises a metal die, and the second physical object comprises a metal part stamped by the metal die.

4. The system of claim 1, wherein the neural network comprises a backpropagation network having at least one input processing element and at least one output processing element.

5. The system of claim 1, wherein the means for operating the neural network comprises a supercomputer.

6. The system of claim 1, wherein the processing means comprises a desk top computer.

7. The system of claim 1, wherein the training parameter generating means generates the plurality of sets of input parameters by modeling the specified transformation process using at least one method selected from the group consisting of Finite Element Analysis, Discrete Event Simulations, and Massively Parallel Processing.

8. A method for creating a first physical object, wherein the first physical object is adapted according to a specified transformation process so as to modify a second physical object, the method comprising the steps of:

(a) generating a plurality of sets of training parameters, each set of training parameters characterizing:
 (i) a sample second physical object,
 (ii) the specified transformation process that results in the sample second physical object, and
 (iii) a sample first physical object that interacts with the specified transformation process so as to modify the sample second physical object;

(b) applying the plurality of sets of training parameters to a neural network so as to train the neural network, wherein each of the plurality of sets of training parameters is processed by a supercomputer over a plurality of patches, each patch comprising a data array, two orthogonal axes crossing the data array and a plurality of regions along the axes, so as to provide at least one single output node by averaging over the plurality of regions without losing information contained in the data array, thereby producing a network definition associated with the trained neural network;

(c) storing in a memory the network definition associated with the trained neural network;

(d) generating a set of second parameters characterizing the second physical object;

(e) generating at a desktop computer a set of first parameters characterizing the first physical object based upon the set of second parameters and the network definition stored by the memory; and (f) creating the first physical object based upon the set of first parameters.

9. The method of claim 8, wherein the first physical object comprises a metal die and the second physical object comprises a metal part.

* * * * *